US012641883B2

(12) United States Patent
Zhao et al.

(10) Patent No.: US 12,641,883 B2
(45) Date of Patent: May 26, 2026

(54) ARRAY SUBSTRATE, PREPARATION METHOD THEREOF, AND DISPLAY DEVICE

(71) Applicants: HEFEI BOE RUISHENG TECHNOLOGY CO., LTD., Hefei (CN); BOE Technology Group Co., Ltd., Beijing (CN)

(72) Inventors: Xue Zhao, Beijing (CN); Xiaodong Xie, Beijing (CN); Min He, Beijing (CN); Xinxiu Zhang, Beijing (CN); Zhaoyi Du, Beijing (CN); Bin Pang, Beijing (CN)

(73) Assignees: HEFEI BOE RUISHENG TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 362 days.

(21) Appl. No.: 18/274,574

(22) PCT Filed: Apr. 1, 2022

(86) PCT No.: PCT/CN2022/084883
§ 371 (c)(1),
(2) Date: Jul. 27, 2023

(87) PCT Pub. No.: WO2023/184505
PCT Pub. Date: Oct. 5, 2023

(65) Prior Publication Data
US 2024/0429246 A1     Dec. 26, 2024

(51) Int. Cl.
H10D 86/60        (2025.01)
H10D 86/01        (2026.01)
H10D 86/40        (2025.01)
(52) U.S. Cl.
CPC ........... H10D 86/60 (2025.01); H10D 86/021 (2025.01); H10D 86/443 (2025.01)

(58) Field of Classification Search
None
See application file for complete search history.

(56) References Cited
U.S. PATENT DOCUMENTS 6,332,782 B1    12/2001   Bezama et al.
2019/0146256 A1   5/2019   Zhang et al.
(Continued)

FOREIGN PATENT DOCUMENTS

CN        101685218 A      3/2010
CN        102097390 A      6/2011
(Continued)

OTHER PUBLICATIONS

Machine-generated English translation of CN102097390 (Year: 2011).*
(Continued)

*Primary Examiner* — Bo B Jang
(74) *Attorney, Agent, or Firm* — WHDA, LLP

(57) ABSTRACT

The present application provides an array substrate and a preparation method thereof, and a display device. The array substrate includes: a base substrate; a first conductive layer, disposed on the base substrate, including conductive pad groups, each of the conductive pad group includes at least one conductive pad; a second conductive layer, disposed on the first conductive layer facing away from the base substrate, an orthographic projection of at least a partial area of each of the conductive pads in the conductive pad groups on the base substrate does not overlap with an orthographic projection of the second conductive layer on the base substrate; a thickness of the first conductive layer in a direction perpendicular to a plane where the base substrate is located is greater than or equal to a thickness of the second conductive layer in the direction perpendicular to the plane where the base substrate is located.

19 Claims, 7 Drawing Sheets

(56) References Cited

U.S. PATENT DOCUMENTS

| | | | |
|---|---|---|---|
| 2020/0026974 A1 | 1/2020 | Chuang | |
| 2021/0289567 A1 | 9/2021 | Teyeb et al. | |
| 2022/0300114 A1 | 9/2022 | Wang et al. | |
| 2023/0252924 A1 | 8/2023 | Yang et al. | |

FOREIGN PATENT DOCUMENTS

| | | | |
|---|---|---|---|
| CN | 105954922 A | 9/2016 | |
| CN | 206212387 U | 5/2017 | |
| CN | 109799639 A | 5/2019 | |
| CN | 110164326 A | 8/2019 | |
| CN | 110456942 A | 11/2019 | |
| CN | 111243508 A | 6/2020 | |
| CN | 112310141 A | 2/2021 | |
| CN | 112864184 A | 5/2021 | |
| CN | 113851515 A | 12/2021 | |
| EP | 3876278 A1 | 9/2021 | |

OTHER PUBLICATIONS

Machine-generated English translation of CN112310141 (Year: 2021).*

* cited by examiner

VIA

VIA — W1

| Cu1 | Cu2 |

W1

| Cu1 | Cu2 |

ARRAY SUBSTRATE, PREPARATION METHOD THEREOF, AND DISPLAY DEVICE

TECHNICAL FIELD

The present application relates to the field of display technology, in particular to an array substrate, a preparation method thereof, and a display device.

BACKGROUND

With a rapid development in the display technology, mini light emitting diode (Mini LED) and micro light emitting diode (Micro LED) display products have caught extensive attention. The chip welding process is an important step in the preparation of the above two types of display products. In the related art, chips are prone to poor conduction during the welding or repairing process, resulting in poor connection between chips and the array substrate of the display product, which further leads to a decrease in the yield rate and quality of the display product.

SUMMARY

Embodiments of the present application adopt technical solutions below.

In a first aspect, an embodiment of the present application provides an array substrate, including:

a base substrate;

a first conductive layer, disposed on a side of the base substrate, comprising a plurality of conductive pad groups, and each of the conductive pad group comprises at least one conductive pad;

a second conductive layer, disposed on a side of the first conductive layer facing away from the base substrate, wherein an orthographic projection of at least a partial area of each of the conductive pads in the conductive pad groups on the base substrate does not overlap with an orthographic projection of the second conductive layer on the base substrate;

a thickness of the first conductive layer in a direction perpendicular to a plane where the base substrate is located is greater than or equal to a thickness of the second conductive layer in the direction perpendicular to the plane where the base substrate is located.

In some embodiments of the present application, the array substrate further includes a first insulation layer located between the first conductive layer and the second conductive layer, the first insulation layer comprises a plurality of openings, and at least a partial area of the conductive pad is exposed by the opening;

the orthographic projection of the partial area of the conductive pad exposed by the opening on the base substrate does not overlap with the orthographic projection of the second conductive layer on the base substrate.

In some embodiments of the present application, the array substrate includes a display area, the conductive pad groups comprise a first conductive pad group, and the first conductive pad group is located in the display area.

In some embodiments of the present application, the first conductive pad group comprises a first conductive pad, and the orthographic projection of at least a part of the first conductive pad, exposed by the opening, on the base substrate does not overlap with the orthographic projection of the second conductive layer on the base substrate.

In some embodiments of the present application, the array substrate includes a display area and a peripheral area surrounding the display area; the conductive pad groups comprise a second conductive pad group, and the second conductive pad group is located in the peripheral area.

In some embodiments of the present application, the second conductive pad group includes a second conductive pad and a third conductive pad;

the orthographic projection of an area of the second conductive pad, other than an area of the second conductive pad exposed by the opening, on the base substrate partially overlaps with the orthographic projection of the second conductive layer on the base substrate; and the orthographic projection of the third conductive pad on the base substrate does not overlap with the orthographic projection of the second conductive layer on the base substrate.

In some embodiments of the present application, the second conductive layer includes a plurality of connection wires located in the peripheral area, the second conductive pad is electrically connected to the connection wire, and the orthographic projection of the second conductive pad on the base substrate partially overlap with the orthographic projection of the connection wire on the base substrate.

In some embodiments of the present application, the array substrate includes a shielded wire, and the peripheral area comprises a bonding area located on a side of the display area;

a main structure of the shielded wire is located in an area other than the bonding area in the peripheral area, and both ends of the shielded wire extend to the bonding area; the two ends of the shielded wire are respectively electrically connected to the second conductive pad through the connection wires.

In some embodiments of the present application, the shielded wire covers at least a partial area of each of the connection wires, and the shielded wire is in direct contact with each of the connection wires.

In some embodiments of the present application, the first conductive layer includes a first conductive part, and the first conductive part comprises a ground wire located in the display area; the connection wire is electrically connected to the ground wire.

In some embodiments of the present application, the connection wire located in an area other than the bonding area in the peripheral area is electrically connected to the ground wire through a via hole; the connection wire located in the bonding area is electrically connected to the ground wire through the shielded wire.

In some embodiments of the present application, the peripheral area includes a fan-out area located between the bonding area and the display area, and the fan-out area includes a fan-out trace; the third conductive pad is electrically connected to the first conductive part through the fan-out trace.

In some embodiments of the present application, the bonding area includes a first bonding sub-area and a second bonding sub-area, and the first bonding sub-area is located on a side of the second bonding sub-area facing away from the display area;

each of the second conductive pads is located in the first bonding sub-area, and each of the third conductive pads is located in the second bonding sub-area.

In some embodiments of the present application, the second conductive pads are arranged in a same direction, and the third conductive pads are arranged in a same direction, along the arrangement direction of the second conductive pads, a first gap exists between every two adjacent second conductive pads, along the arrangement direction of the third conductive pads, a second gap exists between every two adjacent third conductive pads, a number of sublayers of the first insulation layer filled in the first gap is same as a number of sublayers of the first insulation layer filled in the second gap, and the number of sublayers of the first insulation layer filled in the second gap is greater than a number of sublayers of a part of the first insulation layer, located on a surface of the second conductive pad group facing away from the base substrate.

In some embodiments of the present application, the first insulation layer includes a first inorganic sublayer, a first organic sublayer, a second organic sublayer, and a second inorganic sublayer arranged in sequence, and the first inorganic sublayer is in direct contact with the first conductive layer;

the orthographic projection of the first organic sublayer on the base substrate does not overlap with a part of the base substrate located in the bonding area.

In some embodiments of the present application, the orthographic projections of the first organic sublayer and the second inorganic sublayer on the base substrate do not overlap with the orthographic projection of the second conductive pad on the base substrate; and the orthographic projections of the first organic sublayer and the second inorganic sublayer on the base substrate do not overlap with the orthographic projection of the third conductive pad on the base substrate.

In some embodiments of the present application, at least the first inorganic sublayer, the second organic sublayer, and the second inorganic sublayer are sequentially arranged in the first gap, and at least the first inorganic sublayer, the second organic sublayer, and the second inorganic sublayer are sequentially arranged in the second gap.

In some embodiments of the present application, the array substrate further includes a second insulation layer, located on a side of the second conductive layer facing away from the base substrate;

the second insulation layer fills the first gap and the second gap, and the orthographic projection of the second insulation layer on the base substrate does not overlap with the orthographic projection of at least part of the second conductive pad group on the base substrate.

In some embodiments of the present application, the second insulation layer includes a third inorganic sublayer and a third organic sublayer, and the third organic sublayer is disposed on a side of the third inorganic sublayer facing away from the base substrate;

the third inorganic sublayer and the third organic sublayer are arranged in sequence in the first gap and the second gap, and a part of the third inorganic sublayer located in the gap is in direct contact with a part of the second inorganic sublayer located in the gap.

In some embodiments of the present application, a distance along a thickness direction of the base substrate between the base substrate and a surface of a part of the third organic sublayer, located in the gap, facing away from the base substrate is less than or equal to the following distance; a distance along the thickness direction of the base substrate between the base substrate and a surface of a part of the second organic sublayer, disposed on the second conductive pad group, facing away from the base substrate.

In some embodiments of the present application, the second insulation layer covers a partial area of the connection wire, and the shielded wire covers a partial area of the connection wire.

In some embodiments of the present application, partial positions of an outer contour of the orthographic projection of the second insulation layer on the base substrate are approximately tangent to partial positions of an outer contour of the orthographic projection of the shielded wire on the base substrate.

In some embodiments of the present application, the orthographic projection of the second insulation layer on the base substrate overlaps with the orthographic projection of a partial area of the second conductive pad on the base substrate; and the orthographic projection of the second insulation layer on the base substrate does not overlap with the orthographic projection of a surface of the third conductive pad, facing away from the base substrate, on the base substrate.

In some embodiments of the present application, the array substrate further includes a protective layer, the protective layer covers a part of the first conductive pad exposed from the opening, and the material of the protective layer comprises conductive materials.

In a second aspect, an embodiment of the present application provides a display device, including a light emitting device and the array substrate described above, the light emitting device being electrically connected to the first conductive pad group of the array substrate.

In some embodiments of the present application, the display device further includes a circuit board electrically connected to the second conductive pad group of the array substrate.

In a third aspect, an embodiment of the present application provides a preparation method of an array substrate, for preparing the array substrate described above, the method includes:

providing a base substrate;

forming a first conductive layer, wherein the first conductive layer includes a plurality of conductive pad groups, and each of the conductive pad groups comprises at least one conductive pad;

forming a first inorganic sub-film, a patterned first organic sublayer, a patterned second organic sublayer and a second inorganic sub-film in sequence on the first conductive layer;

forming a second conductive layer; and patterning the first inorganic sub-film and the second inorganic sub-film to obtain the first inorganic sublayer and the second inorganic sublayer, wherein the first insulation layer comprises the first inorganic sublayer, the first organic sublayer, the second organic sublayer and the second inorganic sublayer, and the first insulation layer comprises a plurality of openings, the opening exposes at least a partial area of the conductive pad.

The above description is only a summary of solutions of the present disclosure. In order to learn technical means of the present disclosure more clearly and allow the technical means to be implemented based on the disclosure of the description, and in order to make the above and other objects, features and advantages of the present disclosure more apparent and understandable, specific embodiments of the present disclosure are illustrated below.

BRIEF DESCRIPTION OF THE DRAWINGS

In order to clearly explain technical solutions of embodiments of the present disclosure or the related art, drawings required in the description of the embodiments or the related art are briefly introduced below. Apparently, the drawings in the following description are only some embodiments of the present disclosure. For those skilled in the art, other drawings can be obtained based on these drawings without paying creative work.

DETAILED DESCRIPTION

Figures 1A, 1B, 2A:
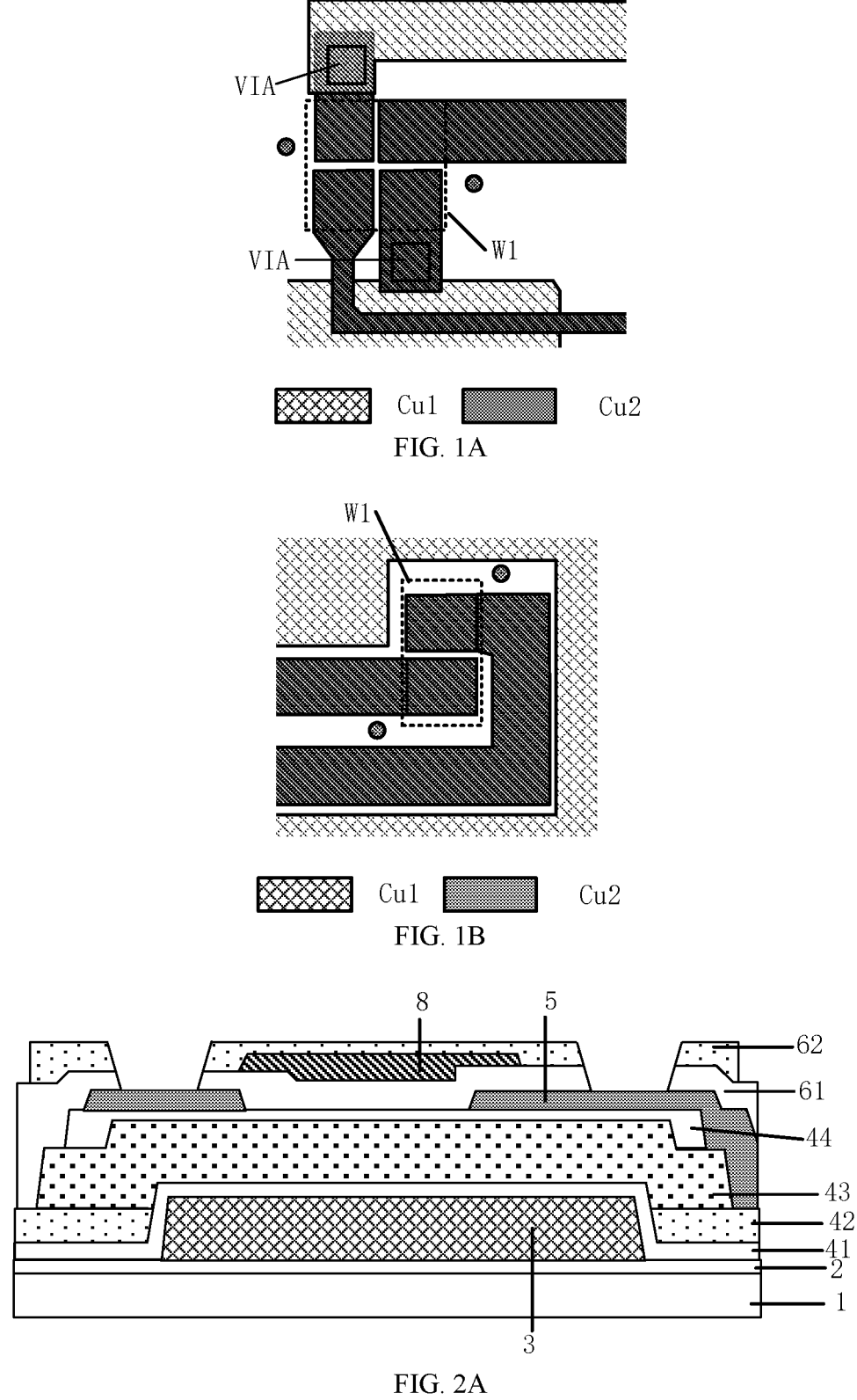
FIG. 1A is a schematic structural diagram illustrating an array substrate in the related art.
FIG. 1B is a schematic structural diagram illustrating an array substrate in the related art.
FIG. 2A is a schematic structural diagram illustrating an array substrate in the related art.

The technical solutions of the embodiments of the present application will be described below with reference to the accompanying drawings of the embodiments of the present application. Apparently, only a part of the embodiments, not all the embodiments of the present application, are described. All other embodiments obtained, based on the embodiments described in the present application, by those skilled in the art without paying creative efforts shall fall within the protection scope of the present application.

In the drawings, the thicknesses of regions and layers may be exaggerated for clarity. The same reference numerals in the drawings denote the same or similar structures, and thus detailed descriptions thereof will be omitted. In addition, the drawings are merely schematic illustrations of the present disclosure and are not necessarily drawn to scale.

The term "comprising" throughout the specification and claims is interpreted in an open and inclusive sense, i.e., "including, but not limited to", unless it is otherwise specified in the context. In the description of the specification, the terms such as "an embodiment", "some embodiments", "exemplary embodiments", "example", "specific examples" or "some examples" are intended to indicate that particular features, structures, materials, or properties related to the embodiment or example are included in at least one embodiment or example of the present application. Schematic representations of the above terms are not necessarily referring to the same embodiment or example. Furthermore, the particular features, structures, materials or characteristics described may be included in any one or more embodiments or examples in any suitable manner.

In the embodiments of the present application, wordings such as "first", "second" are used to distinguish the same or similar items with substantially the same functions and effects, which are only used for clearly describing solutions of the embodiments of the present application, and should not be understood as indicating or implying the relative importance or implying the number of indicated technical features.

Figure 5:
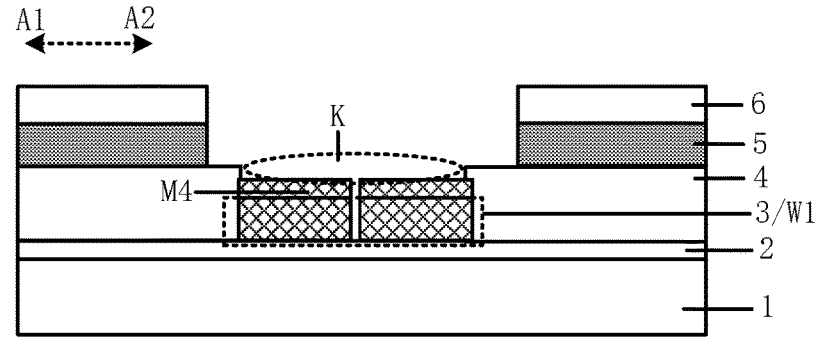
FIG. 5 is a cross-sectional structure diagram along A1A2 direction in FIG. 4.
Figure 14:
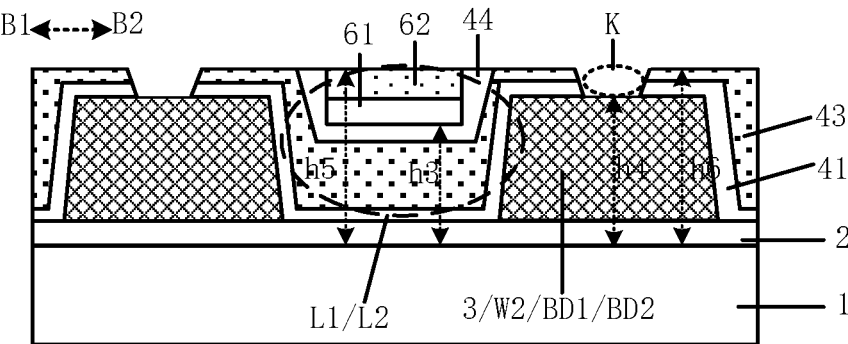
FIG. 14 is a cross-sectional structure diagram along B1B2 direction in FIG. 10 or FIG. 11.

An embodiment of the present application provides an array substrate, as shown in FIG. 5 and FIG. 14, including:
- a base substrate 1;
- a first conductive layer 3, located on a side of the base substrate 1, including a plurality of conductive pad groups W1 and/or W2, and the conductive pad group W1 and/or W2 includes at least one conductive pad; and
- a second conductive layer 5, located on a side of the first conductive layer 3 facing away from the base substrate 1, and an orthographic projection of at least part of each conductive pad in the conductive pad group W1 or W2 on the base substrate 1 and an orthographic projection of the second conductive layer 5 on the base substrate do not overlap with each other;
- the thickness of the first conductive layer 3 in a direction perpendicular to a plane where the base substrate 1 is located is greater than or equal to the thickness of the second conductive layer 5 in the direction perpendicular to the plane where the base substrate 1 is located.

Figure 4:
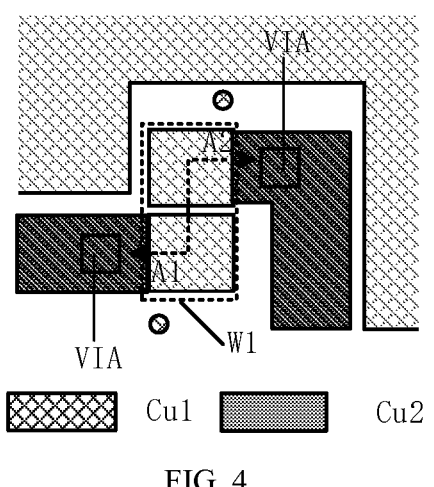
FIG. 4 is a schematic structural diagram illustrating a first conductive pad group provided by an embodiment of the present application.

FIG. 5 is a cross-sectional structure diagram along A1A2 direction in FIG. 4.

In exemplary embodiments, the array substrate may be a mini light emitting diode (Mini LED for short) array substrate; or, the array substrate may be a micro light emitting diode (Micro LED for short) array substrate. Among them, the size of Mini LED is about 100~300 μm, and the size of Micro LED is less than 100 μm.

In an exemplary embodiment, the base substrate 1 may be a glass-based substrate.

In some exemplary embodiments, the base substrate 1 may include an organic resin material such as epoxy resin, triazine, silicon resin, or polyimide. For example, the base substrate 1 may be an FR4 type of printed circuit board (PCB), or may be a flexible PCB that is easily deformed.

In some exemplary embodiments, the base substrate 1 may include a ceramic material such as silicon nitride, AlN, or $Al_2O_3$. Alternatively, the base substrate 1 may include a metal or a metal compound. For example, the base substrate 1 may be a metal core printed circuit board (MCPCB) or a metal copper clad laminate (MCCL).

In an exemplary embodiment, the array substrate includes two conductive layers, for example, the first conductive layer 3 and the second conductive layer 5, which jointly form a conductive pattern.

Exemplarily, a film thickness of the first conductive layer 3 ranges from 1.5 μm to 7 μm, and the material of the first conductive layer includes copper (Cu). Specifically, a laminated material such as MoNb/Cu/MoNb can be formed by sputtering, the bottom layer MoNb (300 Å) is used to improve the adhesion, the middle layer Cu is used to transfer electrical signals, and the top layer MoNb (200 Å) is used to prevent oxidation. Alternatively, the first conductive layer 3 may also be formed by electroplating. Specifically, a seed layer MoNiTi is formed first to increase the grain nucleation density, and the anti-oxidation layer MoNiTi is formed after electroplating Cu.

In an exemplary embodiment, the first conductive layer 3 may be used to dispose various signal lines, for example, ground wires, driving lines, and power lines.

In an exemplary embodiment, the first conductive layer 3 may include a plurality of conductive pad groups, and each of the conductive pad groups includes at least one conductive pad. The conductive pad may be a bonding pad or a bonding terminal.

Figure 13:
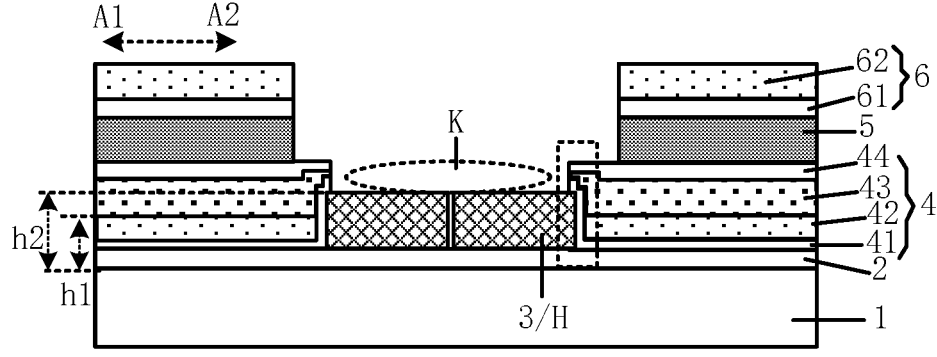
FIG. 13 is another cross-sectional structure diagram along A1A2 direction in FIG. 4.

Exemplarily, as shown in FIG. 13 and FIG. 14, the conductive pad in the first conductive layer 3 includes a partial area exposed by the opening K in the first insulation layer 4 and a partial area covered by the insulation layer around the opening.

The first conductive layer 3 may include a plurality of conductive pad groups, including but not limited to the following three situations:

Situation I, the conductive pad groups in the first conductive layer include the first conductive pad group W1 located in the display area.

Situation II, the conductive pad groups in the first conductive layer include the second conductive pad group W2 located in the bonding area.

Situation III, the conductive pad groups may include the first conductive pad group W1 located in the display area and the second conductive pad group W2 located in the bonding area.

The first conductive pad group W1 is used for electrical connection with components, and the second conductive pad group W2 is used for electrical connection between the array substrate and the circuit board, so as to input electrical signals into the array substrate. Components may include light emitting devices and driver chips.

For example, the light emitting devices may include the Mini LED or the Micro LED.

The quantity of the conductive pads included in each first conductive pad group W1 is not limited here, which can be determined according to the product design.

In some embodiments, as shown in FIG. 13, the first conductive pad group W1 includes the first conductive pad, and the first conductive pad includes a bonding pad H.

Figure 7:
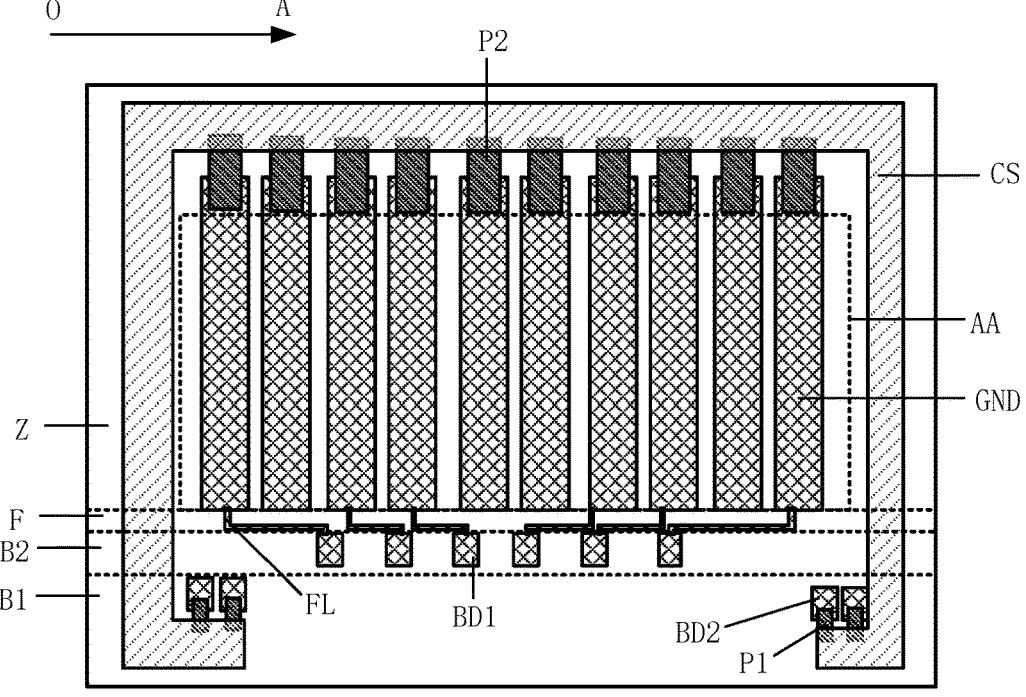
FIG. 7 is a top structural view of an array substrate provided by an embodiment of the present application.

In some embodiments, as shown in FIG. 7, the second conductive pad group W2 includes the second conductive pad and a third conductive pad. The second conductive pad includes a bonding terminal BD2, and the third conductive pad includes a bonding terminal BD1.

Figure 3:
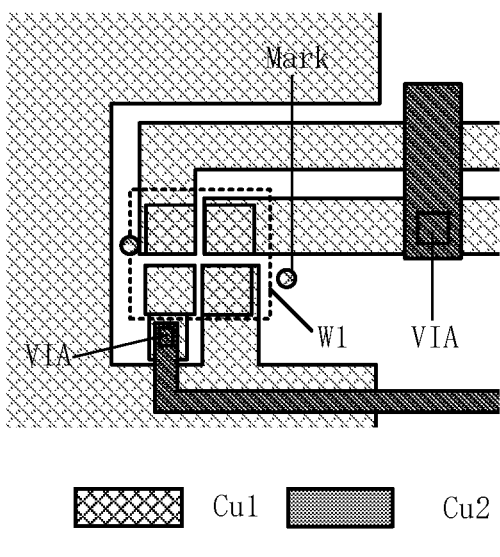
FIG. 3 is a schematic structural diagram illustrating a first conductive pad group provided by an embodiment of the present application.
Figure 15:
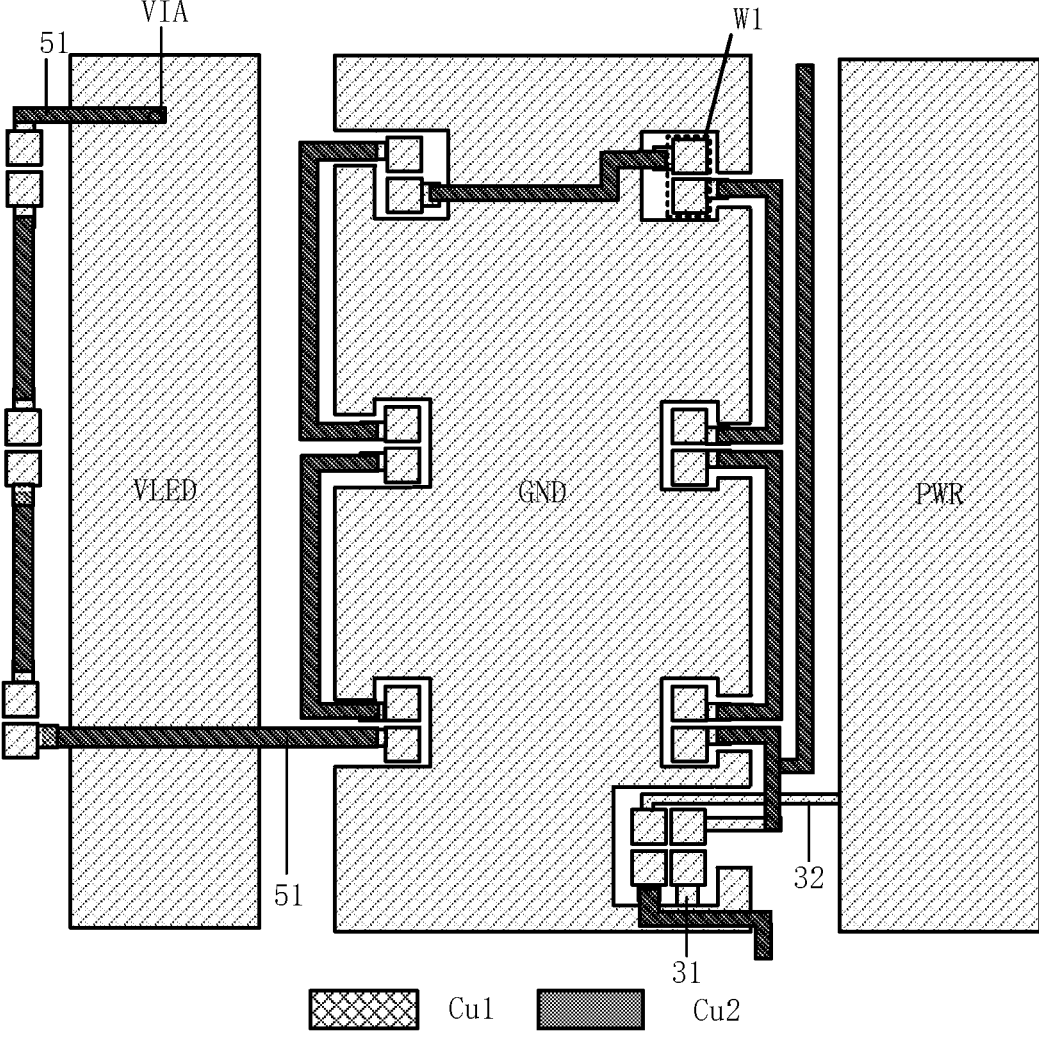
FIG. 15 is a top structural view of a display area provided by an embodiment of the present application.
Figure 16:
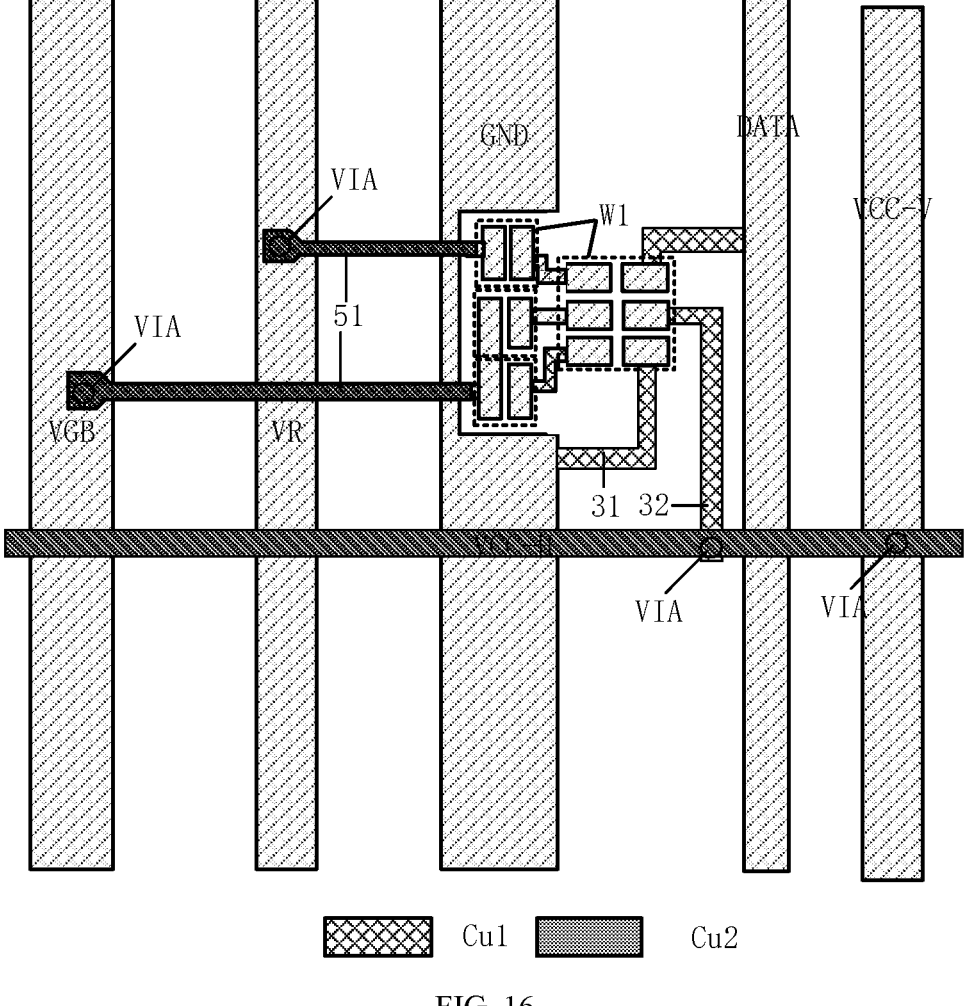
FIG. 16 is a top structural view of another display area provided by an embodiment of the present application.

Exemplarily, as shown in FIG. 3. FIG. 4. FIG. 15 or FIG. 16, the first conductive pad group W1 may include two conductive pads; or, the first conductive pad group W1 may include four conductive pads; or, the first conductive pad group W1 may include six conductive pads.

It should be noted that, as shown in FIG. 3 or FIG. 4, the array substrate further includes a conductive island Mark located in the first conductive layer, which is used as an alignment mark in a subsequent process.

In an exemplary embodiment, the thickness of the second conductive layer 5 is about 6000 Å. The material of the second conductive layer 5 includes copper (Cu), and the second conductive layer can be, for example, a laminated structure of MoNb/Cu/CuNi, among them, the bottom layer of MoNb is used to improve adhesion, the middle layer of Cu is used to transfer electrical signals, and the top layer of CuNi can be used for both anti-oxidation and improvement of firmness.

In an exemplary embodiment, the second conductive layer 5 may be configured to provide leads or wires for connection.

It should be noted that the embodiments of the present application are described with the materials of the first conductive layer 3 and the second conductive layer 5 including copper as an example, thus in the accompanying drawings of the present application. Cu1 represents the first conductive layer 3, and Cu2 represents the second conductive layer 5.

It should also be noted that the plane where the base substrate 1 is located means that although the base substrate 1 is a three-dimensional structure, the thickness thereof is usually relatively thin relative to the length and width, so the base substrate can be understood to tend to a planar structure. Therefore, other structural features in the array substrate are described here with reference to the plane where the base substrate 1 is located. In practical applications, the base substrate 1 is not a plane.

In an exemplary embodiment, the first insulation layer 4 is disposed between the first conductive layer 3 and the second conductive layer 5, and the first insulation layer 4 may include an inorganic sublayer and an organic sublayer.

Referring to FIG. 1A and FIG. 1B, in the related art, in the case that a bonding pad is provided in the second conductive layer 5, when the component 7 installed on the pad is abnormal and needs to be removed in the preparation process of the array substrate, a pit may be formed on the pad during the removal. Thus, the minimum thickness of the pad is very thin. During the process of re-welding components, the welding material and the remaining pad material react at high temperatures to form intermetallic compounds, so that the pad is easily penetrated and the risk of pad fracture is very high.

Figure 2B:
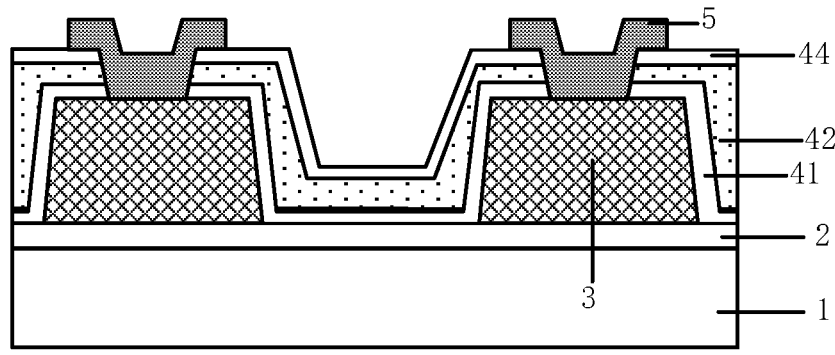
FIG. 2B is a schematic structural diagram illustrating an array substrate in the related art.
Figure 9:
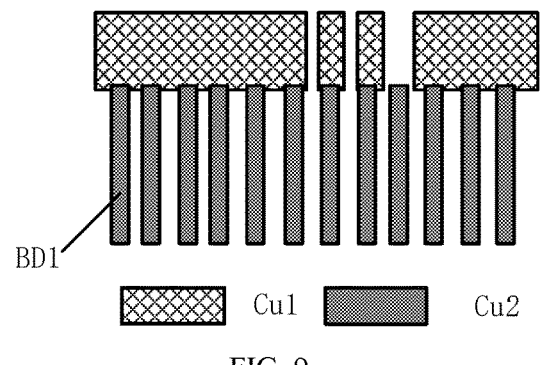
FIG. 9 is a schematic structural diagram illustrating an array substrate in the related art.

FIG. 2B shows a film layer structure in the bonding area in the related art, with reference to FIG. 2B and FIG. 9, since the bonding electrodes in the bonding area need to be electrically connected to a circuit board, if the overall film layer in the bonding area is thick, the peeling of the film layer is easily to occur during the bonding process, for example, partial area of the second conductive layer 5 in the bonding area peels, resulting in conduction abnormality between the array substrate and the circuit board.

Figure 6:
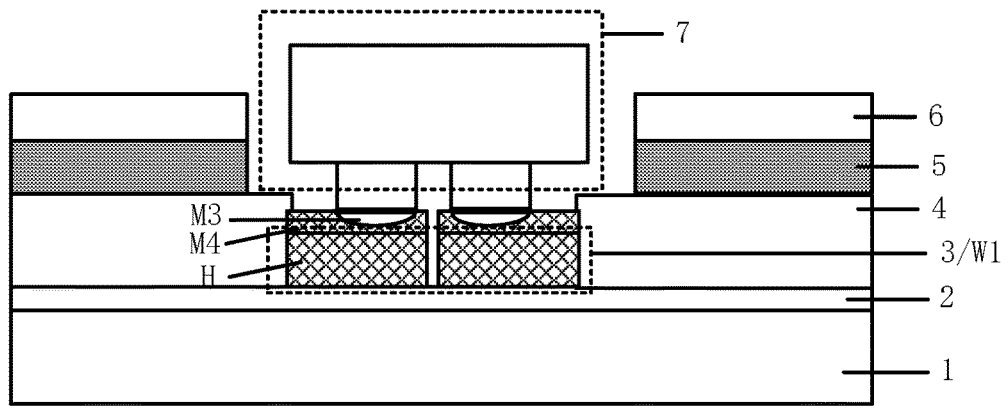
FIG. 6 is a schematic structural diagram illustrating an array substrate for mounting components provided by an embodiment of the present application.

In the embodiments of the present application, since the first conductive layer 3 is generally provided with signal lines with high requirements on resistance, such as ground wires, driving lines, the thickness the first conductive layer 3 in the direction perpendicular to the plane where the base substrate 1 is located is greater than or equal to the thickness of the second conductive layer 5 in the direction perpendicular to the plane where the base substrate 1 is located, and the conductive pad groups are arranged in the first conductive layer 3. On the one hand, when the conductive pad group includes conductive pads located in the display area, as shown in FIG. 6, the probability that a connection layer M3 formed in an array substrate repair (Rework) process penetrates through the first conductive pads can be greatly reduced, improving the poor conduction of the first conductive pad, and improving the repair yield of the array substrate. The connection layer M3 includes an intermetallic compound formed at high temperature between the welding material and the material of the first conductive pad. On the other hand, when the conductive pad group includes conductive pads located in the bonding area, since a part of the first conductive layer 3 is used as the second conductive pad in the bonding area and the third conductive pad in the bonding area, compared with bonding terminals composed of two conductive layers in the related art, the overall film thickness of the area where the second conductive pad and the third conductive pad are located in the embodiment of the present application is reduced, thereby improving the problem of the peeling of partial film layer, due to the thick film layer and the large number of film layers, in the bonding process, reducing the difficulty of the bonding process and improving the quality of the array substrate.

In some embodiments of the present application, as shown in FIG. 5. FIG. 13 and FIG. 14, the array substrate further includes the first insulation layer 4 disposed between the first conductive layer 3 and the second conductive layer 5. There are a plurality of openings K in the first insulation layer, and the opening K exposes at least a partial area of the conductive pad.

The orthographic projection of the partial area of the conductive pad exposed by the opening K on the base substrate 1 does not overlap with the orthographic projection of the second conductive layer 5 on the base substrate 1.

Exemplarily, as shown in FIG. 5 and FIG. 13, the opening K exposes a partial area of each first conductive pad in the first conductive pad group W1. It can be understood that the opening K exposes a connection surface where the first conductive pad is in contact with the components. The orthographic projection of the connection surface on the base substrate 1 and the orthographic projection of the second conductive layer 5 on the base substrate 1 do not overlap with each other.

Exemplarily, as shown in FIG. 14, the opening K exposes a partial area of each conductive pad in the second conductive pad group W2, for example, the opening K exposes a partial area of the second conductive pad, or the opening K exposes a partial area of the third conductive pad.

The size of the opening K in the first insulation layer 4 is not limited here. In FIG. 13, the openings for the conductive pads in the first conductive pad group W are connected together to form a large-sized opening. In FIG. 14, the openings for the conductive pads in the second conductive pad group W2 are disposed independently.

In an exemplary embodiment, the depth of the opening on the second conductive pad group W2 ranges from 0.5 μm to 3 μm.

In some embodiments, the array substrate includes a display area, the conductive pad group includes a first conductive pad group located in the display area.

In some embodiments, the array substrate includes a peripheral area surrounding the display area; the conductive pad group includes a second conductive pad group located in the peripheral area.

In some embodiments, the conductive pad group may include both of the first conductive pad group W1 located in the display area and the second conductive pad group W2 located in the bonding area, that is, the conductive pad group includes the first conductive pad group W1 and the second conductive pad group W2, and the first insulation layer 4 includes a plurality of sublayers.

In some embodiments, as can be seen from a comparison of FIG. 13 and FIG. 14, the number of sublayers of the first insulation layer 4 located between two adjacent first conductive pad groups W1 is greater than or equal to the number of sublayers of the first insulation layer 4 located between the conductive pads in the second conductive pad groups W2.

In some embodiments, the number of sublayers of the first insulation layer 4 located between the conductive pads in the first conductive pad group W1 is greater than or equal to the number of the first insulation layer 4 located between the conductive pads in the second conductive pad group W2.

In some embodiments, the number of sublayers of the first insulation layer 4 located between two adjacent first conductive pad groups W1 is equal to the number of sublayers of the first insulation layer 4 located between the conductive pads in the first conductive pad group W1.

Exemplarily, the number of sublayers of the first insulation layer 4 located between two adjacent first conductive pad groups is 4, the number of sublayers of the first insulation layer 4 located between the conductive pads in the first conductive pad group is 4, and the number of sublayers of the first insulation layer 4 located between the conductive pads in the second conductive pad group W2 is 3.

Exemplarily, the sublayers of the first insulation layer 4 located between two adjacent first conductive pad groups are a first inorganic sublayer 41, a first organic sublayer 42, a second organic sublayer 43 and a second inorganic sublayer 44 respectively, while the sublayers of the first insulation layer 4 located between the conductive pads in the second conductive pad group W2 are the first inorganic sublayer 41, the second organic sublayer 43 and the second inorganic sublayer 44 respectively.

In an exemplary embodiment, the material of the inorganic sublayer in the first insulation layer 4 may include any one of silicon nitride, silicon oxide, and silicon oxynitride, and the material of the organic sublayer in the first insulation layer 4 includes resin.

As can be seen from the comparison of FIG. 13 and FIG. 14, the first organic sublayer 42 is provided around the first conductive pad group W1 is located in the display area, while the first organic sublayer 42 is not provided around the second conductive pad group W2 located in the peripheral area. In this way, in the manufacturing process of the array substrate, the first organic sublayer 42 fills the uneven area existing in the display area, so that the surface of the substrate tends to be flat; when manufacturing the second organic sublayer 43, the organic material of the second organic sublayer 43 has better leveling property, and it is easier to flow into the groove existing in the bonding area, thereby filling the gap between the conductive pads in the second conductive pad group W2 in the bonding area, which is beneficial to the subsequent bonding process, reduces the difficulty of the bonding process, and improves the yield of the bonding process.

Exemplarily, when the conductive pad group includes the first conductive pad group, there is a gap between two adjacent first conductive pads in the first conductive pad group, and an insulation layer is provided in the gap. Specifically, the first inorganic sublayer 41, the first organic sublayer 42, the second organic sublayer 43 and the second inorganic sublayer 44 are sequentially disposed in the gap. In this way, on the one hand, the leveling property of the material of the second organic sublayer 43 in the array substrate can be further improved, so that the material of the second organic sublayer 43 can flow to the peripheral area from the display area more abundantly, thereby reducing the difficulty of the manufacturing process; on the other hand, it can avoid a short circuit occurred between every two adjacent conductive pads in the same first conductive pad W1, and the manufacturing yield of the array substrate is improved.

In some embodiments of the present application, in the case that the conductive pad group includes the first conductive pad group, the first conductive pad group W1 includes the first conductive pad.

The orthographic projection of a part, exposed from the opening K, of the first conductive pad, such as the bonding pad H shown in FIG. 13, on the base substrate 1 does not overlap with the orthographic projection of the second conductive layer 5 on the base substrate 1.

Exemplarily, the first conductive pad is disposed in the display area, and is used for mounting components.

Referring to FIG. 13, the orthographic projection of the first insulation layer 4 on the base substrate 1 overlaps with the orthographic projection of the edge of the first conductive pad group on the base substrate 1.

Exemplarily, the orthographic projection of the first organic sublayer 42 on the base substrate 1 does not overlap with the orthographic projection of the first conductive pad group on the base substrate 1; the orthographic projections of the first inorganic sublayer 41, the second organic sublayer 43, and the second inorganic sublayer 44 on the base substrate 1 partially overlap with the orthographic projections of the first conductive pad group on the base substrate 1 respectively, and the first inorganic sublayer 41, the second organic sublayer 43 and the second inorganic sublayer 44 cover the edge part of each first conductive pad (for example, the bonding pad H) in the first conductive pad group. The first insulation layer 4 between two adjacent first conductive pads in the first conductive pad group W1 is not shown in FIG. 13, and it has a film layer structure similar to that of the edge part of the first conductive pad group.

In the related art, as shown in FIG. 2A, the second conductive layer 5 includes bonding pads. During the manufacturing process of the array substrate, when preparing a nickel-gold layer on the surface of the bonding pads facing away from the base substrate 1 to improve the repair yield, since the second insulation layer 6 covering the edge of the bonding pad is relatively thin, metal ions can easily penetrate the second insulation layer 6 and deposit at a position between the edge of the bonding pad and the second insulation layer 6. In the subsequent process, after the peeling of the nickel-gold layer deposited between the edge of the bonding pad and the second insulation layer 6, two adjacent bonding pads will be conducted, resulting in a short circuit problem.

In the embodiments of the present application, the first conductive pad such as the bonding pad H is disposed in the first conductive layer 3, and the first conductive layer 3 is covered with the first insulation layer. Compared with disposing the bonding pad in the second conductive layer 5, the number of sublayers of the second insulation layer is less, since the number of sublayers of the first insulation layer 4 is greater than the number of sublayers of the second insulation layer 6, the thickness of the insulation layer covering the edge of the first conductive pad is relatively thick. Therefore, the edge of the first conductive pad has a multi-layer protective layer. When manufacturing the protective layer M4 (nickel and/or gold) of the first conductive pad, metal ions are not easy to penetrate the first inorganic sublayer 41, the second organic sublayer 43 and the second inorganic sublayer 44 to infiltrate into the first conductive pad, avoiding the formation of nickel-gold in the edge area of the first conductive pad, thereby avoiding short circuit between adjacent first conductive pads.

In some embodiments of the present application, when the conductive pad group includes the second conductive pad group, the second conductive pad group W2 includes the second conductive pad and the third conductive pad.

Figure 11:
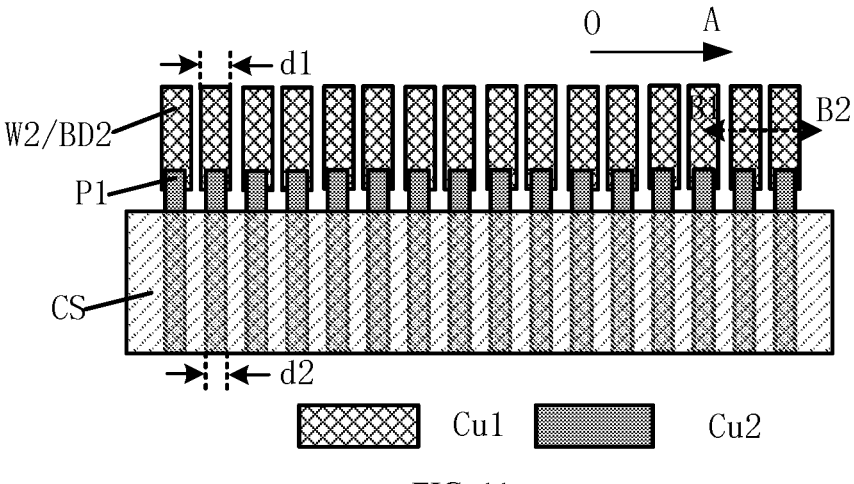
FIG. 11 is a schematic structural diagram illustrating shielded wires located in a peripheral area provided by an embodiment of the present application.

As shown in FIG. 7 and FIG. 11, except for the second conductive pad exposed by the opening K, such as the area of the bonding electrode BD2, the orthographic projection of other areas of the second conductive pad on the base substrate 1 partially overlaps with the orthographic projection of the second conductive layer 5 on the base substrate 1. The opening in the first insulation layer 4 is not shown in FIG. 7 and FIG. 11.

Exemplarily, as shown in FIG. 7, the second conductive layer 5 includes a plurality of connection wires P1 and P2 located in the peripheral area, the second conductive pad, such as the bonding electrode BD2, is electrically connected to the connection wires P1 and P2, and the orthographic projection of the second conductive pad, such as the bonding electrode BD2, on the base substrate 1 partially overlaps the orthographic projection of the connection wire P1 on the base substrate 1.

As shown in FIG. 7, for example, the orthographic projection of the third conductive pad, such as the bonding electrode BD1, on the base substrate 1 and the orthographic projection of the second conductive layer 5 on the base substrate do not overlap each other.

Exemplarily, the second conductive pad and the third conductive pad are disposed in the bonding area for bonding with an external circuit board.

In the embodiments of the present application, the conductive pad group is set to include the second conductive pad group, and the second conductive pad group includes the second conductive pad and the third conductive pad. Compared with the bonding terminal in the related art as shown in FIG. 2B including part of the first conductive layer and part of the second conductive layer, the overall film thickness of the area where the second conductive pad and the third conductive pad are located provided by the embodiment of the present application is reduced, thereby improving the peeling of partial film layers caused by the thick film layer and the large number of film layers during the bonding process, reducing the difficulty of the bonding process and improving the quality of the array substrate.

In some embodiments of the present application, as shown in FIG. 7, the array substrate includes a shielded wire CS, and the peripheral area (including B1, B2, F, and Z) includes a bonding area (including B1 and B2) located on a side of the display area AA.

The main structure of the shielded wire CS is located in the areas F, Z in the peripheral area other than the bonding area, and two ends of the shielded wire CS extend to the bonding areas B1, B2; the two ends of the shielded wire CS are electrically connected to the second conductive pads through the connection wires P1 in the bonding region respectively.

In some embodiments of the present application, as shown in FIG. 7, the shielded wire CS covers at least a partial area of each connection wire P1 and P2, and the shielded wire CS is in direct contact with each connection wire P1 and P2.

In an exemplary embodiment, the shielded wire CS covers at least a partial area of each connection wire P1 and P2 in a manner including but not limited to: the shielded wire CS covering a partial area of each connection wire; or, the shielded wire CS covering all areas of each connection wire.

It should be noted that, when the shielded wire CS covers all areas of each connection wire, the shielded wire CS is in direct contact with a partial area of the connection wires, and is also in contact with a partial area of the surface of the second insulation layer 6 facing away from the connection wires. The specific situation will be described below in conjunction with the positional relationship between the shielded wire CS and the second insulation layer 6.

In an exemplary embodiment, the shape of the ortho-graphic projection of the shielded wire CS on the base substrate 1 is an unclosed ring.

In an exemplary embodiment, the material of the shielded wire CS includes conductive adhesive, such as silver paste.

For another example, the thickness of the silver paste may be about 200 μm, and the size of the silver paste in the direction from the display area to the peripheral area may be about 500 μm. Among them, "about" refers to a dimensional error caused by the fluctuation of the preparation process, which is within the acceptable range of the product.

In practical applications, a protective layer or a cover plate may also be provided on the shielded wire CS to avoid damage to the shielded wire CS.

The material of the protective layer and the cover plate can be an inorganic material, such as glass, silicon nitride, silicon oxide or silicon oxynitride; of course, the material of the protective layer and the cover plate can also be an organic material, such as resin.

In some embodiments of the present application, as shown in FIG. 7, the first conductive layer 3 includes a first conductive part, and the first conductive part includes a ground wire GND located in the display area AA; the connection wires P1 and P2 are electrically connected to the ground wire GND.

Exemplarily, the first conductive part may further include a driving line VLED and a power line PWR as shown in FIG. 15; or, the first conductive part may further include driving lines VR and VGB, data line DATA and vertical power line VCC-V as shown in FIG. 16. The power line in FIG. 16 further includes a horizontal power line VCC-H located in the second conductive layer 5, the vertical power line VCC-V is electrically connected to the horizontal power line VCC-H through a via hole VIA, and the horizontal power line VCC-H is electrically connected to the first conductive pad.

Specifically, in FIG. 15, the first conductive part further includes a first lead 31 and a second lead 32, and the second conductive layer further includes a trace 51. A first conductive pad group W1 for mounting a driver chip is first electrically connected, through a connection trace, for example the connection trace 51 located in the second conductive layer 5, to a first conductive pad group W1 for mounting a light emitting device, and then electrically connected to the driving line VLED through the connection trace 51.

In FIG. 16, the first conductive part further includes a first lead 31 and a second lead 32, and the second conductive layer further includes a trace 51. The first conductive pad group W1 for mounting the driving chip is first electrically connected to the first conductive pad group W1 for mounting the light emitting device, and then electrically connected to the driving line VR or VGB through the connection trace 51. The array substrate shown in FIG. 16 includes two kinds of driving lines, the light emitting device for emitting red light is connected to the driving line VR, and the light emitting devices for emitting green light and blue light share the driving line VGB.

In an exemplary embodiment, for the first conductive pad shown in FIG. 15 and FIG. 16, a distance exists between the first conductive pad and the second conductive layer (for example, the trace 51) which is closest to the first conductive pad along a direction parallel to the base substrate 1. For products with a protective layer (nickel-gold) on the first conductive pad, within the scope allowed by the design and manufacturing process, the greater the distance between the first conductive pad and the second conductive layer closest to the first conductive pad in the direction parallel to the base substrate 1 is, the better it is. This is to prevent metal ions from infiltrating into the vicinity of the second conductive layer and affecting the electrical properties of the second conductive layer when the protective layer is formed on the first conductive pad.

In the embodiment of the present application, the connection wires include the connection wire P1 located in the bonding area and a connection wire P2 located outside the bonding area. The connection wire P2 located in the area Z other than the bonding area in the peripheral area is directly electrically connected to the ground wire GND through a via hole (not shown in FIG. 7); the connection wire P1 located in the bonding area is electrically connected to the ground wire GND through the shielded wire CS.

In FIG. 7, a ground wire GND extending in the vertical direction is drawn as an example, in this case, for facilitating connection, the connection wire P2 is disposed on the upper side of the display area AA, and the connection wire P1 is disposed on the bottom side of the display area AA. In practical applications, the connection wire P2 can be disposed on the left side of the display area AA, or can also be disposed on the right side of the display area. Regardless of the direction in which the ground wire is arranged, the connection wire P2 is disposed at an end of the ground wire GND, and is electrically connected to the ground wire GND through a via hole, and the shielded wire CS covers partial area of the connection wire P2. The connection wire P1 is disposed in the vicinity of the other end of the ground wire GND, and the connection wire P1 is electrically connected to the ground wire GND through the shielded wire CS.

In the embodiment of the present application, the connection wires P1 and P2 are both electrically connected to the shielded wire CS, and each connection wire P1 and P2 is directly or indirectly electrically connected to the ground wire GND, so that the shielded wire CS is electrically connected to the ground wire GND. In this way, on the one hand, by arranging the shielded wire CS, the antistatic capability of the array substrate can be improved; on the other hand, the shielded wire CS is electrically connected to the ground wire GND, so that the resistance of the ground wire GND can be reduced, and the signal transmission capability of the line can be improved.

In the related art, partial areas of the first conductive layer or the second conductive layer are used as shielded wires. However, in the embodiments of the present application, the shielded wire CS is not disposed in the first conductive layer 3 and the second conductive layer 5, and the material of the shielded wire CS is conductive adhesive instead of metal material. Therefore, the impact of disposing the first conductive layer or the second conductive layer in the peripheral region on the cutting process is avoided. In addition, as for the shielded wire CS made from conductive adhesive, since the shielded wire CS is manufactured after the cutting process, a cutting edge distance that needs to be reserved is also small, and the shielded wire CS has little influence on the cutting process, which can significantly reduce the size of the peripheral area of the array substrate, and reserve more design space for the display area, which is conducive to the preparation of display products with narrow bezels.

In some embodiments of the present application, as shown in FIG. 7, the peripheral area includes a fan-out area F located between the bonding area (including B1 and B2) and the display area AA. The fan-out area F includes: a fan-out trace FL; and a third conductive pad, for example BD1, electrically connected to the first conductive part through the fan-out trace FL.

In an exemplary embodiment, the first conductive part includes the ground wire GND, and the third conductive pad, for example BD1, which is electrically connected to the ground wire GND through the fan-out trace FL.

In some embodiments, the first conductive part may further include the driving line VLED and the power line PWR shown in FIG. 15. Some third conductive pads (for example BD1) are electrically connected to the driving line VLED through the fan-out trace FL, and some other third conductive pads (for example BD1) are electrically connected to the power line PWR through the fan-out trace FL.

Alternatively, the first conductive part may further include the driving lines VR and VGB, the data line DATA, and the vertical power line VCC-V as shown in FIG. 16. Some third conductive pads (for example BD1) are electrically connected to the driving lines VR and VGB through the fan-out trace FL, some other third conductive pads (for example BD1) are electrically connected to the data line DATA through the fan-out trace FL, and some another third conductive pads (for example BD1) are electrically connected to the vertical power line VCC-V through the fan-out trace FL.

In some embodiments, the first conductive part may further include some dummy traces. Some third conductive pads (for example BD1) are electrically connected to the dummy traces through the fan-out trace FL.

It should be noted that, the description related to "some third conductive pads, some other third conductive pads, and some another third conductive pads" in the embodiments of the present application does not mean that only these three parts of the third conductive pad are included. In some embodiments, a fourth part of the third conductive pads may also be included, which may be determined according to actual conditions. In addition, the meanings of relevant descriptions elsewhere in this application are similar to those here, and will not be repeated here.

In an exemplary embodiment, the fan-out traces FL may be located in the first conductive layer 3; or, the fan-out traces FL may be located in the second conductive layer 5; or, some of the fan-out traces FL are located in the first conductive layer 3, the other fan-out traces FL are located on the second conductive layer 5. The details may be determined according to actual product requirements, and are not limited here.

Figure 8:
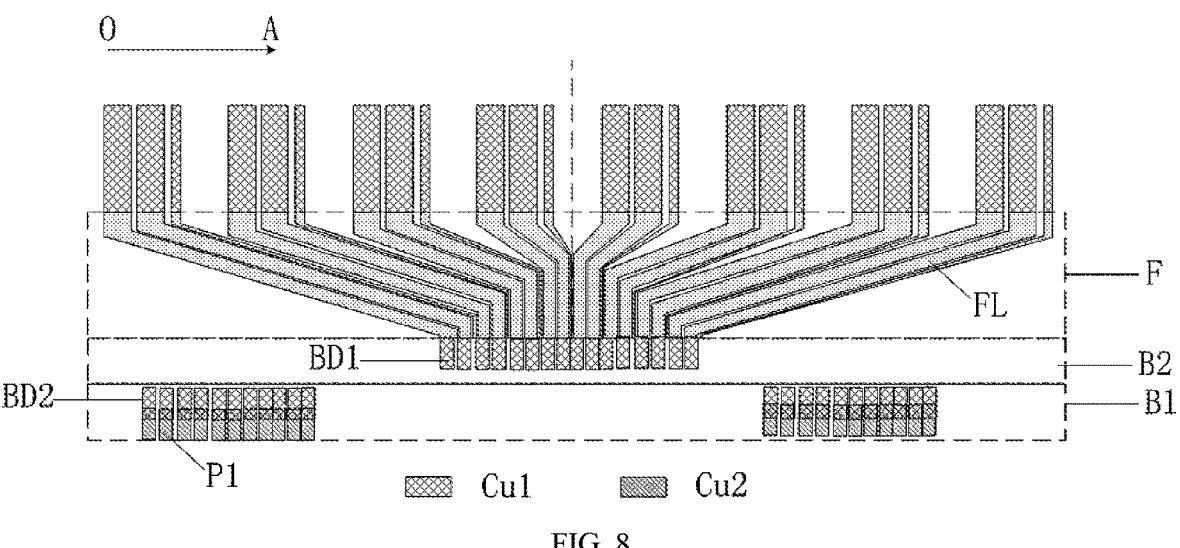
FIG. 8 is a schematic structural diagram illustrating a second conductive pad group in a peripheral area of an array substrate provided by an embodiment of the present application.

In some embodiments of the present application, as shown in FIG. 7 and FIG. 8, the bonding area includes a first bonding sub-area B1 and a second bonding sub-area B2, and the first bonding sub-area B1 is located on a side of the second bonding sub-area B2 facing away from the display area AA; various second conductive pads, for example BD2, are located in the first bonding sub-area B1, and various third conductive pads, for example BD1, are located in the second bonding sub-area B2, the second conductive pad and the third conductive pad both include bonding terminals.

In an exemplary embodiment, the second conductive pads are sequentially arranged along the same direction, for example the OA direction, and the third conductive pads are sequentially arranged along the same direction, for example the OA direction.

In practical applications, the arrangement direction of the second conductive pads can also be a direction other than the OA direction, and the arrangement direction of the third conductive pads can also be a direction other than the OA direction, which can be determined according to actual conditions. In addition, in the present application, there is no limitation on whether the arrangement direction of the second conductive pads is the same as the arrangement direction of the third conductive pads.

In the embodiment of the present application, the second conductive pads and the third conductive pads are arranged in two rows in the first bonding sub-area B1 and the second bonding sub-area B2 respectively, so that each third conductive pad in the second bonding sub-area B2 is electrically connected to the fan-out trace FL, and the fan-out trace FL is electrically connected to one end of the ground wire GND, and each second conductive pad in the first bonding sub-area B1 is electrically connected to the other end of the ground wire GND through the connection wire P1 and the shielded wire CS in sequence. In this way, the number of fan-out traces FL can be reduced, the design space in the fan-out area F can be increased, and the size of the fan-out area F can be reduced, which can greatly reduce the size of the peripheral area, and is beneficial to the preparation of products with narrow bezels.

In some embodiments, a part of the third conductive pads can be disposed in an area on the left side of the second conductive pads, and another part of the third conductive pads can be disposed in an area on the right side of the second conductive pads, so that the size of the peripheral area is further reduced.

Figure 10:
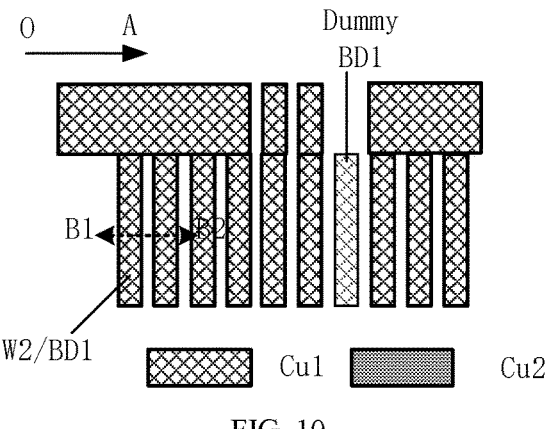
FIG. 10 is a partially enlarged view of a second conductive pad group provided in an embodiment of the present application.

In some embodiments of the present application, as shown in FIG. 10 and FIG. 11, the second conductive pads are arranged in sequence along the same direction, for example the OA direction, and the third conductive pads are arranged in sequence along the same direction, for example the OA direction. In the arrangement direction OA of the second conductive pads, a first gap exists between every two adjacent second conductive pads, for example between BD2, and in the arrangement direction OA of the third conductive pads, a second gap exists between every two adjacent third conductive pads, for example between BD1. The numbers of sublayers of the first insulation layer 4 filled in the first gap and the second gap are the same, and the number of sublayers of the first insulation layer 4 filled in the second gap is greater than that of the first insulation layer located at the surface of the base substrate 1 facing away from the second conductive pad group W2.

In an exemplary embodiment, the thickness of the sublayers in the first insulation layer 4 filled in the first gap along the direction perpendicular to the plane where the base substrate 1 is located is approximately equal to the thickness of the sublayers in the first insulation layer 4 filled in the second gap along the direction perpendicular to the plane where the base substrate 1 is located. "Approximately equal to" means that the thickness fluctuates within the allowable error range due to the fluctuation of the preparation process. The meaning of the plane where the base substrate is located is similar to that described above, and will not be repeated here.

In an exemplary embodiment, the second conductive pad group W2 includes the second conductive pad and the third conductive pad, and the number of sublayers of the first insulation layer 4, located on the surface of the second conductive pad facing away from the base substrate 1, is equal to the number of sublayers of the first insulation layer 4, located on a side of the third conductive pad facing away from the base substrate 1.

In an exemplary embodiment, the thickness of the sublayers of the first insulation layer 4, located on the surface of the second conductive pad facing away from the base substrate 1, along the direction perpendicular to the plane where the base substrate 1 is approximately equal to the thickness of the sublayers of the first insulation layer 4, located on the side of the third conductive pad facing away from the base substrate 1.

In the embodiment of the present application, a larger quantity of first insulation layer 4 or thicker sublayers of the first insulation layer 4 are disposed in the first gap and the second gap. On the one hand, the first insulation layer 4 can fill the first gap and the second gap, avoiding the influence of the existing gap on the alignment process in the bonding process, improving the yield of the bonding process, and reducing the difficulty of the bonding process. On the other hand, fewer or thinner sublayers of the first insulation layer 4 are provided on the surface of the second conductive pad group W2 facing away from the base substrate, so that thickness of the film layers on the second conductive pad group W2 in the bonding region is relatively thin, which avoids the problem of partial peeling of the film layer in the bonding area or poor bonding during the bonding process with the circuit board or flexible circuit board.

In some embodiments of the present application, as shown in FIG. 13 and FIG. 14, the first insulation layer 4 includes a first inorganic sublayer 41, a first organic sublayer 42, a second organic sublayer 43 and a second inorganic sublayer 44 arranged in sequence. The first inorganic sublayer 41 is in direct contact with the first conductive layer.

FIG. 14 is a cross-sectional view along the B1B2 direction in FIG. 10 or FIG. 11. In FIG. 14, the orthographic projection of the first organic sublayer 42 on the base substrate 1 does not overlap with a part of the base substrate 1 located in the bonding area.

In an exemplary embodiment, referring to FIG. 13, the orthographic projection of the first organic sublayer 42 on the base substrate 1 overlaps with a part of the base substrate 1 located in the display area.

Exemplarily, as shown in FIG. 13, the distance h1 is equal to less than the distance h2, where h1 is the distance between the surface of the first organic sublayer 42 facing away from the base substrate 1 and the base substrate 1 along the thickness direction of the base substrate 1, h2 is the distance between the surface of the first conductive pad, for example a bonding pad H, facing away from the base substrate 1 and the base substrate 1 along the thickness direction of the base substrate 1.

It can be understood that in actual products, the first organic sublayer 42 is not provided on a part of the array substrate located in the bonding area, while the first organic sublayer 42 is provided on a part of the array substrate located in the display area.

In the embodiment of the present application, the first organic sublayer 42 is provided in the display area as shown in FIG. 13, while the first organic sublayer 42 is not provided in the bonding area as shown in FIG. 14. During the preparation of the array substrate, since organic materials usually have leveling properties, the first organic sublayer 42 is provided to fill the grooves in the display area first, so that the surface of the substrate tends to be flat, and when the second organic sublayer is prepared 43, the organic material of the second organic sublayer 43 has better leveling property, and it is easier to flow into the bonding region to fill the first gap L1 and the second gap L2 existed in the bonding area. It should be noted that the above filling is not necessarily full.

In some embodiments of the present application, as shown in FIG. 13 and FIG. 14, the orthographic projections of the first organic sublayer 42 and the second inorganic sublayer 44 on the base substrate do not overlap with the orthographic projection of the second conductive pad, for example BD2, on the base substrate 1. The orthographic projections of the first organic sublayer 42 and the second inorganic sublayer 44 on the base substrate 1 do not overlap with the orthographic projection of the third conductive pad, for example BD1, on the base substrate 1.

In the embodiment of the present application, neither the surface of the second conductive pad facing away from the base substrate 1 nor the surface of the third conductive pad facing away from the base substrate 1 is provided with the first organic sublayer 42 and the second inorganic sublayer 44, so that the thickness of the film layer where the second conductive pad and the third conductive pad are located is reduced, which is convenient to bond the second conductive pad and the third conductive pad to the output terminals in the circuit board respectively, reducing the difficulty of the bonding process, and avoiding partially peeling of the film layer where the second conductive pad and the third conductive pad are located during the bonding process, thus solving the problem of poor bonding.

In some embodiments of the present application, as shown in FIG. 14, at least the first inorganic sublayer 41, the second organic sublayer 43 and the second inorganic sublayer 44 are sequentially arranged in the first gap L1, and at least the first inorganic sublayer 41, the second organic sublayer 43 and the second inorganic sublayer 44 are sequentially arranged in the second gap L2.

In an exemplary embodiment, a minimum distance h3, along the thickness direction of the base substrate 1, between the surface of the second inorganic sublayer 44 facing away from the base substrate 1 and the base substrate 1 is smaller than a distance h4, along the thickness direction of the base substrate 1, between the surface of the second conductive pad (or third conductive pad) facing away from the base substrate 1 and the base substrate 1.

In some embodiments of the present application, as shown in FIG. 13 and FIG. 14, the array substrate further includes a second insulation layer 6, and the second insulation layer 6 is located on a side of the second conductive layer 5 facing away from the base substrate 1.

The second insulation layer 6 fills the first gap L1 and the second gap L2, and the orthographic projection of the second insulation layer 6 on the base substrate 1 and the orthographic projection of at least part of the second conductive pad group W2 on the base substrate do not overlap with each other.

The second insulation layer 6 includes a third inorganic sublayer 61 and a third organic sublayer 62, and the third organic sublayer 62 is located on a side of the third inorganic sublayer 61 facing away from the base substrate 1.

The third inorganic sublayer 61 and the third organic sublayer 62 are also arranged in sequence in the first gap L1 and the second gap L2, and a part of the third inorganic sublayer 61 located in the gaps L1 and L2 is in direct contact with a part of the second inorganic sublayer 44 located in the gaps L1 and L2.

In some embodiments of the present application, the orthographic projection of the second insulation layer 6 on the base substrate 1 overlaps with the orthographic projection of a partial area of the second conductive pad, such as a partial area of BD2, on the base substrate 1, and the orthographic projection of the second insulation layer 6 on the base substrate 1 does not overlap with the orthographic projection of another part of the second conductive pad on the base substrate 1; the orthographic projection of the second insulation layer 6 on the base substrate 1 does not overlap with the orthographic projection of the surface of the third conductive pad, for example BD1, facing away from the base substrate 1 on the base substrate.

Figure 12:
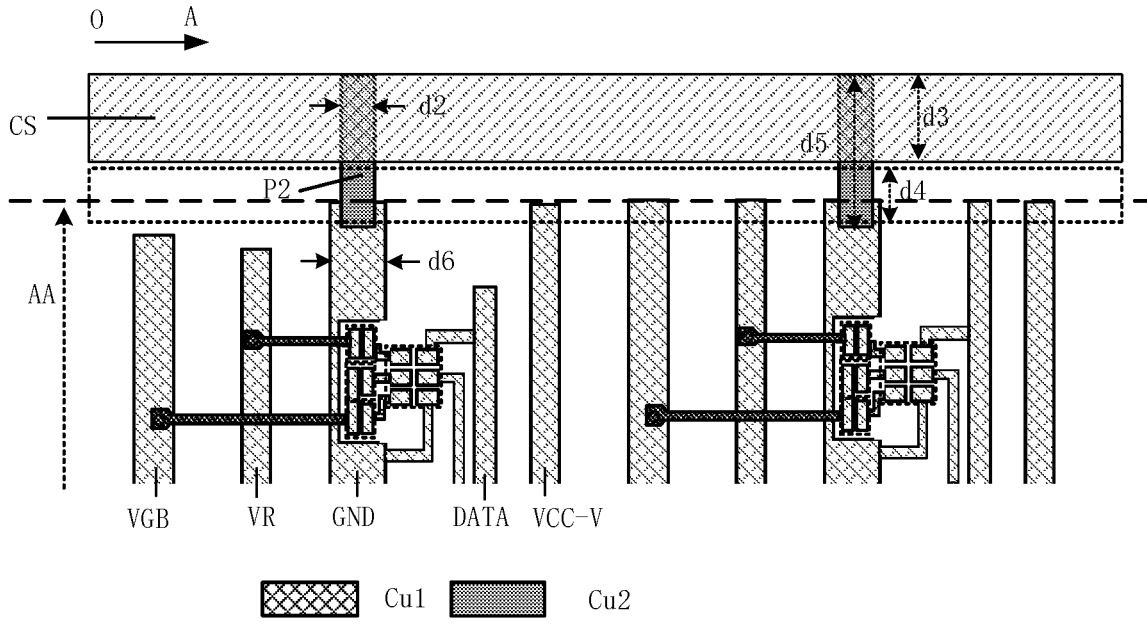
FIG. 12 is a schematic structural diagram illustrating shielded wires located in a peripheral area provided by another embodiment of the present application.

In an exemplary embodiment, referring to FIG. 11 and FIG. 12, the second insulation layer 6 may cover a partial area on the second conductive pad within an area in the dotted line block in FIG. 12, and expose the remaining part of the second conductive pad for covering the shielded wire CS. In this way, the part of the exposed second conductive pad can be prevented from being oxidized or corroded, so as to protect the second conductive pad.

In an exemplary embodiment, in order to reduce the difficulty of the manufacturing process, the second insulation layer may be provided throughout the dotted line block in FIG. 12, that is to say, the second insulation layer 6 may cover a partial area of each second conductive pad, and may also extend to cover an area between two adjacent second conductive pads.

In an exemplary embodiment, as shown in FIG. 10, the second insulation layer 6 is not provided in the area where the third conductive pad, for example BD1, is located.

In some embodiments of the present application, the distance h5, along the thickness direction of the base substrate 1, between the base substrate 1 and the surface of a part of the third organic sublayer 62 located in the gaps L1 and L2 facing away from the base substrate 1 is equal to or less than the distance h6, along the thickness direction of the base substrate 1, between the base substrate 1 and the surface of a part of the second organic sublayer 43 disposed on the second conductive pad group (including the second conductive pad and the third conductive pad) facing away from the base substrate 1.

In FIG. 14, the distance h5, along the thickness direction of the base substrate 1, between the base substrate 1 and the surface of a part of the third organic sublayer 62 located in the gaps L1 and L2 facing away from the base substrate 1 is equal to the distance h6, along the thickness direction of the base substrate 1, between the base substrate 1 and the surface of a part of the second organic sublayer 43 disposed on the second conductive pad group (including the second conductive pad and the third conductive pad) facing away from the base substrate 1.

In the embodiment of the present application, the first gap L1 and the second gap L2 are filled as far as possible through the first insulation layer 4 and the second insulation layer 6, and the third organic sublayer 62 in the gap cannot protrude from the part of the second organic sublayer 43 disposed on the second conductive pad group. In this way, the accuracy of the alignment process in the bonding process can be improved, and in addition, poor bonding between the second conductive pad group and the circuit board caused by the excessively high insulation layer filled in the gap can be avoided.

In some embodiments of the present application, as shown in FIG. 12, the second insulation layer 6 covers a part of the connection wire P2, and the shielded wire CS covers a part of the connection wire P2.

Here, there is no limitation on whether the shielded wire CS covering the connection wire overlaps with the second insulation layer 6 covering the connection wire.

In an exemplary embodiment, there is a gap between partial positions of an outer contour of the orthographic projection of the second insulation layer 6 on the base substrate 1 and partial positions of an outer contour of the orthographic projection of the shielded wire CS on the base substrate 1, so that a part of the connection wire P2 is exposed. Referring to FIG. 12, in this case, the sum of a width d3 of the shielded wire CS and a width d4 of a part of the second insulation layer 6 covering the connection wire P2 is smaller than the length d5 of the connection wire P2.

In an exemplary embodiment, partial positions of the orthographic projection of the second insulation layer 6 on the base substrate 1 overlap with partial positions of the orthographic projection of the shielded wire CS on the base substrate 1. Accordingly, the second insulation layer 6 covers a partial area of the connection wire and is in direct contact with this area, the shielded wire CS covers another partial area of the connection wire and is in direct contact with this area. In addition, the shielded wire CS also extends to a partial area of the second insulation layer 6 facing away from the surface of the connection wire, and is in direct contact with this partial area of the second insulation layer 6. In this case, the sum of the width d3 of the shielded wire CS and the width d4 of the part of the second insulation layer 6 covering the connection wire P2 is greater than the length d5 of the connection wire P2.

When partial positions of the outer contour of the orthographic projection of the second insulation layer 6 on the base substrate 1 are exactly tangent to partial positions of the outer contour of the orthographic projection of the shielded wire CS on the base substrate 1, the sum of the width d3 of the shielded wire CS and the width d4 of the part of the second insulation layer 6 covering the connection wire P2 is equal to the length d5 of the connection wire P2.

In an exemplary embodiment, partial positions of the outer contour of the orthographic projection of the second insulation layer 6 on the base substrate 1 are approximately tangent to partial positions of the outer contour of the orthographic projection of the shielded wire CS on the base substrate 1. In this way, the part of the exposed second conductive pad can be prevented from being oxidized or corroded, so as to protect the second conductive pad.

"Approximately tangent" means that the partial positions of the outer contour of the orthographic projection of the second insulation layer 6 on the base substrate 1 and the partial positions of the outer contour of the orthographic projection of the shielded wire CS on the base substrate 1 fluctuate within an error tolerance range.

In some embodiments of the present application, referring to FIG. 12, the size d2, along the direction OA perpendicular to the reference plane, of the connection wire P2 located in an area of the peripheral area other than the bonding area is smaller than or equal to the size d6, along the direction OA perpendicular to the reference plane, of the ground wire GND; the size d2, along the direction OA perpendicular to the reference surface, of the connection wire P1 electrically connected to the second conductive pad is smaller than or equal to the size d1, along the direction OA perpendicular to the reference plane, of the second conductive pad. An extending direction OB of the connection wire and the thickness direction OC of the base substrate 1 are respectively parallel to the reference plane.

In this way, it is possible to prevent the connection wire from covering the side surface of the second conductive pad (or the side surface of the ground wire), further avoiding climbing, cracks or breakage in part of the connection wire area, thereby improving the quality of the array substrate.

In some embodiments of the present application, referring to FIG. 5 and FIG. 6, the array substrate further includes a protective layer M4 covering a part of the first conductive pad, for example the bonding pad H, exposed at the opening K, and the material of the protective layer M4 includes the conductive material.

The number of bonding pads included in one first conductive pad group W1 is not limited here, for example, it may be 2, 3, 4, 6 or 8, which may be determined according to actual conditions.

Exemplarily, the material of the protective layer M4 includes nickel and/or gold.

In the embodiment of the present application, during the welding process, the welding material preferentially reacts with the material of the protective layer M4 to form a metal interlayer compound, so as to form the connecting layer M3 to play a connecting role. The protective layer M4 can protect the first conductive pad, the connection layer M3 includes the metal interlayer compound.

The array substrate provided in the embodiment of the present application further includes a dummy bonding electrode (Dummy BD1) and some dummy traces. Of course, other structures and components such as a black matrix layer 8 and a buffer layer 2 in FIG. 2A are also included, only structures and components related to the invention point are introduced here. For other structures and components included in the array substrate, reference may be made to related technologies.

An embodiment of the present application provides a display device, including a light emitting device and the above array substrate, and the light emitting device is electrically connected to the first conductive pad group.

In an exemplary embodiment, the display device may further include a driving chip for providing a driving signal to the display device.

Exemplarily, the light emitting device may include a Mini LED or a Micro LED. The size of Mini LED is about 100~300 μm, and the size of Micro LED is less than 100 μm.

In an exemplary embodiment, the cross-sectional size of the light emitting device (parameters such as length, width or diagonal or diameter) is about 100 μm~300 μm; the thickness of the light emitting device is, for example, 100 μm. "About" includes but is not limited to the following situations; due to the fluctuation of the manufacturing process, the size of the component fluctuates, and it should be noted that the size fluctuation is within the allowable range of error.

In some embodiments of the present application, the display device further includes a circuit board electrically connected to the second conductive pad group.

The circuit board may include a flexible circuit board.

The number of circuit boards included in the display device is not limited here, and may be specifically determined according to actual conditions.

The display device can be used as a backlight device, or the display device can also be directly used as a display, which is not limited here.

In the embodiment of the present application, since the display device includes the above-mentioned array substrate, the first conductive layer 3 in the array substrate is generally provides with signal lines with high resistance requirements such as ground wires and driving lines. Since the thickness of the first conductive layer 3 in a direction perpendicular to the plane where the base substrate 1 is located is greater than or equal to the thickness of the second conductive layer 5 in the direction perpendicular to the plane where the base substrate 1 is located, the conductive pad group is disposed in the first conductive layer 3. On the one hand, as shown in FIG. 6, the probability that the connection layer M3 formed in the array substrate repair (Rework) process penetrates the first conductive pad is greatly reduced, improving the problem of poor conduction of the first conductive pad, and improving the repair yield of the array substrate. The connection layer M3 includes an intermetallic compound formed at high temperature between the welding material and the material of the first conductive pad. On the other hand, since partial area of the first conductive layer 3 is used as the second conductive pad in the bonding area and the third conductive pad in the bonding area, compared with bonding terminals composed of two conductive layers in the related art, the overall film thickness of the area where the second conductive pad and the third conductive pad are located in the embodiment of the present application is reduced, thereby improving the problem of the peeling of partial film layer, due to the thick film layer and the large number of film layers, in the bonding process, reducing the difficulty of the bonding process and improving the quality of the array substrate.

This application does not specifically limit the use of the display device, which can be any product or part with display function, such as TVs, notebook computers, tablet computers, wearable display devices, mobile phones, vehicle displays, navigation, e-books, digital photo frames, advertising light boxes.

An embodiment of the present application provides a preparation method of an array substrate, for preparing the array substrate described above, and the method includes steps described below.

At S01, a base substrate is provided.

At S02, a first conductive layer is formed, the first conductive layer includes a plurality of conductive pad groups, and each of the conductive pad groups includes at least one conductive pad.

At S03, a first inorganic sub-file, a patterned first organic sublayer, a patterned second organic sublayer and a second inorganic sub-film sequentially formed on the first conductive layer.

At S04, a second conductive layer is formed.

At S05, the first inorganic sub-film and the second inorganic sub-film are patterned to obtain a first inorganic sublayer and a second inorganic sublayer. The first insulation layer includes the first inorganic sublayer, the first organic sublayer, the second organic sublayer and the second inorganic sublayer, the first insulation layer includes a plurality of openings, and the openings expose at least part of the conductive pad.

It should be noted that, in the embodiments of the present application, "thin film" refers to an entire film layer formed before patterning.

In the embodiment of the present application, when preparing the first insulation layer, a patterned first organic sublayer and a patterned second organic sublayer are prepared first, so that the second inorganic thin film covers the first conductive layer, after forming the second conductive layer, the second inorganic thin film is patterned, so that in the process of forming the second conductive layer, the second inorganic thin film protects the exposed partial area of the first conductive layer (such as the exposed partial area of the conductive pad) to avoid damaging the exposed partial area of the first conductive layer, and the reliability of the array substrate is improved.

The manufacturing method of other structures in the array substrate provided in the embodiments of the present application can be determined in combination with the manufacturing method in the related art, and will not be repeated here.

The above are merely exemplary implementations of the present disclosure, but the protection scope of the present disclosure is not limited thereto. Any changes or substitutions easily conceived by those skilled in the art based on the contents of the present disclosure fall within the protection scope of the present disclosure. Therefore, the protection scope of the present disclosure shall be defined by the appended claims.

The invention claimed is:

1. An array substrate, comprising:
a base substrate;
a first conductive layer, disposed on a side of the base substrate, comprising a plurality of conductive pad groups, and each of the conductive pad groups comprises at least one conductive pad;
a second conductive layer, disposed on a side of the first conductive layer facing away from the base substrate, wherein an orthographic projection of at least a partial area of each of the conductive pads in the conductive pad groups on the base substrate does not overlap an orthographic projection of the second conductive layer on the base substrate;
a first insulation layer located between the first conductive layer and the second conductive layer, the first insulation layer comprises a plurality of openings, and at least a partial area of each of the conductive pads is exposed by the openings;
wherein a thickness of the first conductive layer in a direction perpendicular to a plane where the base substrate is located is greater than or equal to a thickness of the second conductive layer in the direction perpendicular to the plane where the base substrate is located;
wherein an orthographic projection of the partial area of each of the conductive pads exposed by the openings on the base substrate does not overlap the orthographic projection of the second conductive layer on the base substrate.

2. The array substrate according to claim 1, wherein the array substrate comprises a display area, the conductive pad groups comprise a first conductive pad group, and the first conductive pad group is located in the display area, wherein the first conductive pad group comprises a first conductive pad, and an orthographic projection of at least a part of the first conductive pad, exposed by the openings, on the base substrate does not overlap the orthographic projection of the second conductive layer on the base substrate.

3. The array substrate according to claim 1, wherein the array substrate comprises a display area and a peripheral area surrounding the display area; the conductive pad groups comprise a second conductive pad group, and the second conductive pad group is located in the peripheral area;
wherein the second conductive pad group comprises second conductive pads and third conductive pads;
an orthographic projection of an area of each of the second conductive pads, other than an area of the second conductive pads exposed by the openings, on the base substrate partially overlaps the orthographic projection of the second conductive layer on the base substrate; and orthographic projections of the third conductive pads on the base substrate do not overlap the orthographic projection of the second conductive layer on the base substrate.

4. The array substrate according to claim 3, wherein the second conductive layer comprises a plurality of connection wires located in the peripheral area, second conductive pads are electrically connected to the connection wires, and the orthographic projections of the second conductive pads on the base substrate partially overlap orthographic projections of the connection wires on the base substrate.

5. The array substrate according to claim 4, wherein the array substrate comprises a shielded wire, and the peripheral area comprises a bonding area located on a side of the display area;
a main structure of the shielded wire is located in an area other than the bonding area in the peripheral area, and two ends of the shielded wire extend to the bonding area; the two ends of the shielded wire are respectively electrically connected to the second conductive pads through the connection wires;
wherein the shielded wire covers at least a partial area of each of the connection wires, and the shielded wire is in direct contact with each of the connection wires.

6. The array substrate according to claim 5, wherein the first conductive layer comprises a first conductive part, and the first conductive part comprises a ground wire located in the display area; the connection wires are electrically connected to the ground wire;
wherein the connection wires located in an area other than the bonding area in the peripheral area are electrically connected to the ground wire through via holes; the connection wires located in the bonding area are electrically connected to the ground wire through the shielded wire.

7. The array substrate according to claim 6, wherein the peripheral area comprises a fan-out area located between the bonding area and the display area, and the fan-out area comprises fan-out traces; the third conductive pads are electrically connected to the first conductive part through the fan-out traces.

8. The array substrate according to claim 5, wherein the bonding area comprises a first bonding sub-area and a second bonding sub-area, and the first bonding sub-area is located on a side of the second bonding sub-area facing away from the display area;
wherein each of the second conductive pads is located in the first bonding sub-area, and each of the third conductive pads is located in the second bonding sub-area.

9. The array substrate according to claim 8, wherein the second conductive pads are arranged in a same direction, and the third conductive pads are arranged in a same direction, along the arrangement direction of the second conductive pads, a first gap exists between every two adjacent second conductive pads, along the arrangement direction of the third conductive pads, a second gap exists between every two adjacent third conductive pads,
wherein a number of sublayers of the first insulation layer filled in the first gap is same as a number of sublayers of the first insulation layer filled in the second gap, and the number of sublayers of the first insulation layer filled in the second gap is greater than a number of sublayers of a part of the first insulation layer, located on a surface of the second conductive pad group facing away from the base substrate.

10. The array substrate according to claim 9, wherein the first insulation layer comprises a first inorganic sublayer, a first organic sublayer, a second organic sublayer, and a second inorganic sublayer arranged in sequence, and the first inorganic sublayer is in direct contact with the first conductive layer;

wherein an orthographic projection of the first organic sublayer on the base substrate does not overlap a part of the base substrate located in the bonding area.

11. The array substrate according to claim 10, wherein the orthographic projection of the first organic sublayer and an orthographic projection of the second inorganic sublayer on the base substrate do not overlap the orthographic projections of the second conductive pads on the base substrate; and the orthographic projections of the first organic sublayer and the second inorganic sublayer on the base substrate do not overlap the orthographic projections of the third conductive pads on the base substrate.

12. The array substrate according to claim 11, wherein at least the first inorganic sublayer, the second organic sublayer, and the second inorganic sublayer are sequentially arranged in the first gap, and at least the first inorganic sublayer, the second organic sublayer, and the second inorganic sublayer are sequentially arranged in the second gap.

13. The array substrate according to claim 12, wherein the array substrate further comprises a second insulation layer, located on a side of the second conductive layer facing away from the base substrate;

wherein the second insulation layer fills the first gap and the second gap, and an orthographic projection of the second insulation layer on the base substrate does not overlap an orthographic projection of at least part of the second conductive pad group on the base substrate.

14. The array substrate according to claim 13, wherein the second insulation layer comprises a third inorganic sublayer and a third organic sublayer, and the third organic sublayer is disposed on a side of the third inorganic sublayer facing away from the base substrate;

wherein the third inorganic sublayer and the third organic sublayer are arranged in sequence in the first gap and the second gap, and the third inorganic sublayer is in direct contact with the second inorganic sublayer in the first gap and the second gap;

wherein a distance along a thickness direction of the base substrate between the base substrate and a surface of a part of the third organic sublayer, located in the first and the second gap, facing away from the base substrate is less than or equal to the following distance: a distance along the thickness direction of the base substrate between the base substrate and a surface of a part of the second organic sublayer, disposed on the second conductive pad group, facing away from the base substrate.

15. The array substrate according to claim 13, wherein the second insulation layer covers a partial area of the connection wires, and the shielded wire covers a partial area of the connection wires;

wherein partial positions of an outer contour of an orthographic projection of the second insulation layer on the base substrate are approximately tangent to partial positions of an outer contour of an orthographic projection of the shielded wire on the base substrate.

16. The array substrate according to claim 13, wherein an orthographic projection of the second insulation layer on the base substrate overlaps an orthographic projection of a partial area of the second conductive pad on the base substrate; and the orthographic projection of the second insulation layer on the base substrate does not overlap an orthographic projection of a surface of the third conductive pads, facing away from the base substrate, on the base substrate.

17. The array substrate according to claim 3, further comprising a protective layer, wherein the protective layer covers a part of the first conductive pad exposed from the openings, and a material of the protective layer comprises conductive materials.

18. A display device, comprising a light emitting device and the array substrate according to claim 1, the light emitting device being electrically connected to a first conductive pad group in the conductive pad groups of the array substrate.

19. A preparation method of an array substrate, the method comprises:

providing a base substrate;

forming a first conductive layer, wherein the first conductive layer comprises a plurality of conductive pad groups, and each of the conductive pad groups comprises at least one conductive pad;

forming a first inorganic sub-film, a patterned first organic sublayer, a patterned second organic sublayer and a second inorganic sub-film in sequence on the first conductive layer;

forming a second conductive layer; and patterning the first inorganic sub-film and the second inorganic sub-film to obtain a first inorganic sublayer and a second inorganic sublayer, wherein the first inorganic sublayer, the first organic sublayer, the second organic sublayer and the second inorganic sublayer form a first insulation layer, and the first insulation layer comprises a plurality of openings, at least a partial area of each of the conductive pads is exposed by the openings;

wherein a thickness of the first conductive layer in a direction perpendicular to a plane where the base substrate is located is greater than or equal to a thickness of the second conductive layer in the direction perpendicular to the plane where the base substrate is located;

wherein an orthographic projection of the partial area of each of the conductive pads exposed by the openings on the base substrate does not overlap an orthographic projection of the second conductive layer on the base substrate.

* * * * *